(12) United States Patent
Steiger et al.

(10) Patent No.: US 9,059,299 B2
(45) Date of Patent: Jun. 16, 2015

(54) METHOD FOR PRODUCING HIGH-PERFORMING AND ELECTRICALLY STABLE SEMI-CONDUCTIVE METAL OXIDE LAYERS, LAYERS PRODUCED ACCORDING TO THE METHOD AND USE THEREOF

(75) Inventors: Juergen Steiger, Taipei (TW); Duy Vu Pham, Oberhausen (DE); Anita Neumann, Recklinghausen (DE); Alexey Merkulov, Recklinghausen (DE); Arne Hoppe, Herne (DE)

(73) Assignee: Evonik Degussa GmbH, Essen (DE)

( * ) Notice: Subject to any disclaimer, the term of this patent is extended or adjusted under 35 U.S.C. 154(b) by 0 days.

(21) Appl. No.: 14/348,948

(22) PCT Filed: Sep. 12, 2012

(86) PCT No.: PCT/EP2012/067804
§ 371 (c)(1),
(2), (4) Date: Oct. 29, 2014

(87) PCT Pub. No.: WO2013/050221
PCT Pub. Date: Apr. 11, 2013

(65) Prior Publication Data
US 2015/0053966 A1    Feb. 26, 2015

(30) Foreign Application Priority Data
Oct. 7, 2011 (DE) .......................... 10 2011 084 145

(51) Int. Cl.
*H01L 29/786* (2006.01)
*H01L 21/02* (2006.01)
(Continued)

(52) U.S. Cl.
CPC .... *H01L 29/78696* (2013.01); *H01L 21/02472* (2013.01); *H01L 21/02483* (2013.01);
(Continued)

(58) Field of Classification Search
CPC .............. H01L 29/78696; H01L 29/24; H01L 29/6696; H01L 29/7869; H01L 21/02565; H01L 21/02664; H01L 21/02686
USPC ................................................ 257/43; 438/10
See application file for complete search history.

(56) References Cited

U.S. PATENT DOCUMENTS 8,546,594 B2    10/2013  Steiger et al.
2006/0094168 A1  5/2006  Hoffman et al.
(Continued)

FOREIGN PATENT DOCUMENTS

WO    WO 2006/049791 A1    5/2006

OTHER PUBLICATIONS

International Search Report issued Dec. 7, 2012 in PCT/EP2012/067804.
(Continued)

*Primary Examiner* — Peter Bradford
(74) *Attorney, Agent, or Firm* — Oblon, McClelland, Maier & Neustadt, L.L.P.

(57) ABSTRACT

The present invention relates to a method for producing a semi-conductor laminate comprising a first and a second metal oxide layer as well as a dielectric layer, wherein the first metal oxide layer is arranged between the second metal oxide layer and the dielectric layer. The first and second metal oxide layers are formed accordingly from a first and a second liquid phase. The present invention also relates to a semi-conductor laminate that can be obtained from such a method, and to electronic components comprising such a semi-conductor laminate.

25 Claims, 3 Drawing Sheets

(51) Int. Cl.
    *C23C 18/12*     (2006.01)
    *C23C 18/14*     (2006.01)
    *H01L 29/66*     (2006.01)
    *H01L 29/24*     (2006.01)

(52) U.S. Cl.
CPC .... *H01L21/02554* (2013.01); *H01L 21/02565* (2013.01); *H01L 21/02614* (2013.01); *H01L 21/02628* (2013.01); *H01L 29/7869* (2013.01); *C23C 18/1208* (2013.01); *C23C 18/1225* (2013.01); *C23C 18/1279* (2013.01); *C23C 18/14* (2013.01); *H01L 29/66969* (2013.01); *H01L 21/02664* (2013.01); *H01L 29/24* (2013.01)

(56) References Cited

U.S. PATENT DOCUMENTS

| | | | |
|---|---|---|---|
| 2008/0197414 A1 | 8/2008 | Hoffman et al. | |
| 2010/0308326 A1 | 12/2010 | Kim et al. | |
| 2011/0193084 A1 | 8/2011 | Thiem et al. | |
| 2011/0309313 A1 | 12/2011 | Steiger et al. | |
| 2011/0315982 A1 | 12/2011 | Hoppe et al. | |
| 2012/0181488 A1 | 7/2012 | Steiger et al. | |
| 2012/0202318 A1 | 8/2012 | Steiger et al. | |
| 2013/0104773 A1 | 5/2013 | Steiger et al. | |
| 2013/0122647 A1 | 5/2013 | Steiger et al. | |
| 2013/0221352 A1 | 8/2013 | Steiger et al. | |
| 2014/0267508 A1* | 9/2014 | Ohashi et al. | 347/70 |

OTHER PUBLICATIONS

Yutaka Ohya, et al., "Fabrication of zinc oxide transparent thin-film transistor with $ZrO_2$ insulating layer by sol-gel method", Japanese Journal of Applied Physics, vol. 44, No. 4A, XP-001245802, 2005, pp. 1919-1922.

David Hong, et al., "Transparent thin-film transistor exploratory development via sequential layer deposition and thermal annealing", Thin Solid Films, vol. 515, No. 4, XP-025007668, 2006, pp. 2717-2721.

H.P. Song, et al., "The growth of ZnO on bcc-$In_2O_3$ buffer layers and the valence band offset determined by X-ray photoemission spectroscopy", Solid State Communications, vol. 150, No. 41-42, XP-027491192, 2010, pp. 1991-1994.

U.S. Appl. No. 14/407,681, filed Dec. 12, 2014, Steiger, et al.

* cited by examiner

METHOD FOR PRODUCING HIGH-PERFORMING AND ELECTRICALLY STABLE SEMI-CONDUCTIVE METAL OXIDE LAYERS, LAYERS PRODUCED ACCORDING TO THE METHOD AND USE THEREOF

FIELD OF THE INVENTION

The present invention relates to a process for producing a semiconductor laminate comprising a first and a second metal oxide layer and a dielectric layer, the first metal oxide layer being arranged between the second metal oxide layer and the dielectric layer. The first and second metal oxide layers are formed correspondingly from a first and a second liquid phase. The present invention likewise relates to a semiconductor laminate which is obtainable by such a process and to electronic components comprising such a semiconductor laminate.

BACKGROUND OF THE INVENTION

Semiconductive metal oxides, for example ZnO, $In_2O_3$ and $SnO_2$, are well known in the literature. They possess high charge carrier mobilities with simultaneous optical transparency. In commercial use, semiconductive metal oxides are currently being applied from the gas phase either by means of sputtering or other deposition methods. JP2007-073704 teaches formation of oxidic semiconductor components, in which various oxide layers are applied successively by means of sputtering.

Hong et al. (Thin Solid Films (2006) 515: 2717-2721), teach the repeated, successive application of individual thin oxide layers with one type of metal atom each by means of sputtering processes.

Song et al. (Solid State Communications (2010) 150: 1991-1994) teach the application of a zinc oxide layer on an indium oxide layer by means of metal-organic chemical gas phase deposition (MOCVD).

Kumomi et al. (Journal of Display Technology (2009) 5 (12):531-540) discuss the In—X—O system with various elements X. The In—X—O layer is applied by means of co-sputtering.

These methods are disadvantageous since they are technically complex and are associated with high costs in the purchase of the equipment used therefor.

For this reason, the literature is increasingly discussing liquid phase coating methods. In these processes, for example, oxide nanoparticles in a dispersion, or precursor molecules in a solvent, are used as liquid phases. Layers which are produced from the liquid phase differ, however, in several aspects from those which have been produced from the gas phase, since the use of solvents often causes residues of these solvent molecules to be incorporated into the layer. In addition, for example in the case of precursor solutions, the chemical conversion to the oxide is not always homogeneous.

A known problem in the case of semiconductive metal oxides with only one type of metal atom, irrespective of the process by which they have been produced, is inadequate stability both with respect to atmospheric influences and with respect to electrical stress, the latter being particularly commercially important.

A solution to this problem is the use of more complex metal oxides with two or more different types of metal atoms. In sputtering or vapour deposition technology, preference is therefore given to using systems such as indium gallium zinc oxide, since they are particularly stable. This approach has also been taken in liquid phase systems.

WO2010/122274 A1 teaches the formation of particularly stable components from solution by the introduction of alkali metal or alkaline earth metal atoms into the layer.

Kim et al. (APPLIED PHYSICS LETTERS (2010) 96: 163506) teach the liquid phase-based production of stable components by the incorporation of Mg metal atoms into the semiconductor layer.

US 2006-0088962 A1 teaches the application of oxidic dielectrics from solution to a semiconductor component for improvement of the semiconductor properties.

Nevertheless, in the known processes, particularly in the case of solutions or dispersions which have been optimized for optimal oxide layer formation at comparatively low conversion temperatures, it is not possible to directly add other metal atoms without having to accept disadvantages. Examples of disadvantages include a chemical reaction with the original solution, disruption of layer formation or an inhomogeneous stoichiometric ratio of the metal atoms on the surface. In these cases, the desired advantages with regard to electrical stability simultaneously entail disadvantages, for example a reduction in charge carrier mobility in the semiconductor layer.

The present invention overcomes the known disadvantages.

SUMMARY OF THE INVENTION

The present invention relates to a process for producing a semiconductor laminate comprising a first metal oxide layer, a second metal oxide layer and a dielectric layer, the first metal oxide layer being arranged between the second metal oxide layer and the dielectric layer, and the process comprising (i) the forming of a first metal oxide layer comprising at least one metal oxide selected from the group consisting of indium oxide, gallium oxide, zinc oxide, tin oxide or mixtures thereof from a first liquid phase, the first metal oxide layer having a layer thickness of ≤20 nm and the first liquid phase comprising at least one metal oxide or at least one metal oxide precursor, the metal oxide being selected from the group consisting of indium oxide, gallium oxide, zinc oxide, tin oxide or mixtures thereof, and (ii) the forming of a second metal oxide layer comprising at least one metal oxide selected from the group consisting of gallium oxide, zinc oxide, tin oxide, hafnium oxide, silicon oxide, aluminium oxide, titanium oxide, alkali metal oxides, alkaline earth metal oxides or mixtures thereof from a second liquid phase, the second liquid phase comprising at least one metal oxide or at least one metal oxide precursor, the metal oxide being selected from the group consisting of gallium oxide, zinc oxide, tin oxide, hafnium oxide, silicon oxide, aluminium oxide, titanium oxide, alkali metal oxides, alkaline earth metal oxides or mixtures thereof, and the at least one metal oxide of the first layer and the at least one metal oxide of the second layer being different.

In various embodiments of the process, the first metal oxide layer has a layer thickness of 0.5-20 nm.

In some embodiments of the process, the second metal oxide layer has at least the layer thickness of the first metal oxide layer.

In further embodiments of the process, the second metal oxide layer comprises at least one metal oxide not present in the first metal oxide layer.

In particular embodiments of the process, the second metal oxide layer comprises at least two metal oxides.

In various embodiments of the process, the first metal oxide layer comprises at least two metal oxides.

In further embodiments of the process, the second metal oxide layer comprises silicon oxide.

In some embodiments of the process, the first metal oxide layer consists essentially of indium oxide ($In_2O_3$) or indium gallium oxide, i.e. the first metal oxide layer in the case of indium oxide comprises indium to an extent of at least 51% by weight and, in the case of indium gallium oxide, the metals indium and gallium together to an extent of at least 51% by weight, based in each case on the proportions by mass of the metals present in the layer.

In particular embodiments of the process, the second metal oxide layer consists essentially, i.e. to an extent of at least 51% by weight, based on the proportions by mass of all metals present in the layer, of ZnO, $Ga_2O_3$, $HfO_2$, $SiO_2$, silicon gallium oxide or silicon hafnium oxide.

In various embodiments of the process, the forming of the first metal oxide layer comprises the applying of the first liquid phase to the dielectric layer and the depositing of the at least one metal oxide or of the at least one metal oxide precursor of the first liquid phase on the dielectric layer in order to form the first metal oxide layer on the dielectric layer. In these embodiments, the forming of the second metal oxide layer comprises the applying of the second liquid phase to the first metal oxide layer, and the depositing of the at least one metal oxide or of the at least one metal oxide precursor of the second liquid phase on the first metal oxide layer in order to form the second metal oxide layer on the first metal oxide layer. In other embodiments of the process, the forming of the second metal oxide layer comprises the applying of the second liquid phase to a substrate and the depositing of the at least one metal oxide or of the at least one metal oxide precursor of the second liquid phase on the substrate in order to form the second metal oxide layer on the substrate. In these embodiments, the forming of the first metal oxide layer comprises the applying of the first liquid phase to the second metal oxide layer and the depositing of the at least one metal oxide or of the at least one metal oxide precursor of the first liquid phase on the second metal oxide layer in order to form the first metal oxide layer on the second metal oxide layer, and the applying of the dielectric layer to the first metal oxide layer.

In various embodiments of the process the first and/or second liquid phase are applied by processes selected from the group consisting of printing processes, spraying processes, rotary coating processes, dipping processes and slot-die coating.

In further embodiments of the process, the at least one metal oxide precursor of the first and/or second liquid phase originates from the class of the metal alkoxides and/or metal oxo alkoxides.

In various embodiments of the process, the first and/or second liquid phase comprise at least one organic solvent.

In further embodiments of the process, the first and/or second liquid phase comprise at least one organic solvent, the organic solvent being essentially anhydrous. An essentially anhydrous solvent is understood to mean a solvent containing a maximum of 500 ppm of water.

In some embodiments of the process, the first and/or second liquid phase comprise at least one metal oxide in the form of a metal oxide particle.

In several embodiments of the process, the first and/or second liquid phase comprise an aqueous phase.

In further embodiments of the process, the forming of the first and/or second metal oxide layer further comprises a heat treatment of the first and/or second liquid phase.

In some embodiments of the process, the forming of the first and/or second metal oxide layer comprises the irradiation of the first and/or second liquid phase with electromagnetic radiation, especially UV, IR and/or VIS radiation. In a particular embodiment, for example, irradiation of the first and/or second liquid phase with UV radiation is effected before, after or during a heat treatment of the first and/or second liquid phase.

In further embodiments of the process, the first and/or second metal oxide layer are formed under an oxygenous atmosphere, especially air.

In various embodiments of the process, the first and/or second metal oxide layer are heat-treated at a temperature of 100-450° C., preferably at 150-350° C.

In some embodiments of the process, the first metal oxide layer has a layer thickness of 0.5-10 nm, preferably 2-5 nm.

In a further aspect, the present invention relates to a semiconductor laminate which is produced by a process of the present invention.

The present invention further comprises an electronic component which comprises a semiconductor laminate of the present invention.

Likewise part of the present invention is an electronic component which comprises a semiconductor laminate of the present invention, the electronic component being a transistor, a thin-film transistor, a diode, a solar cell, a sensor, an RFID tag or a TFT back panel for visual display units.

DETAILED DESCRIPTION OF THE INVENTION

Figure 1:
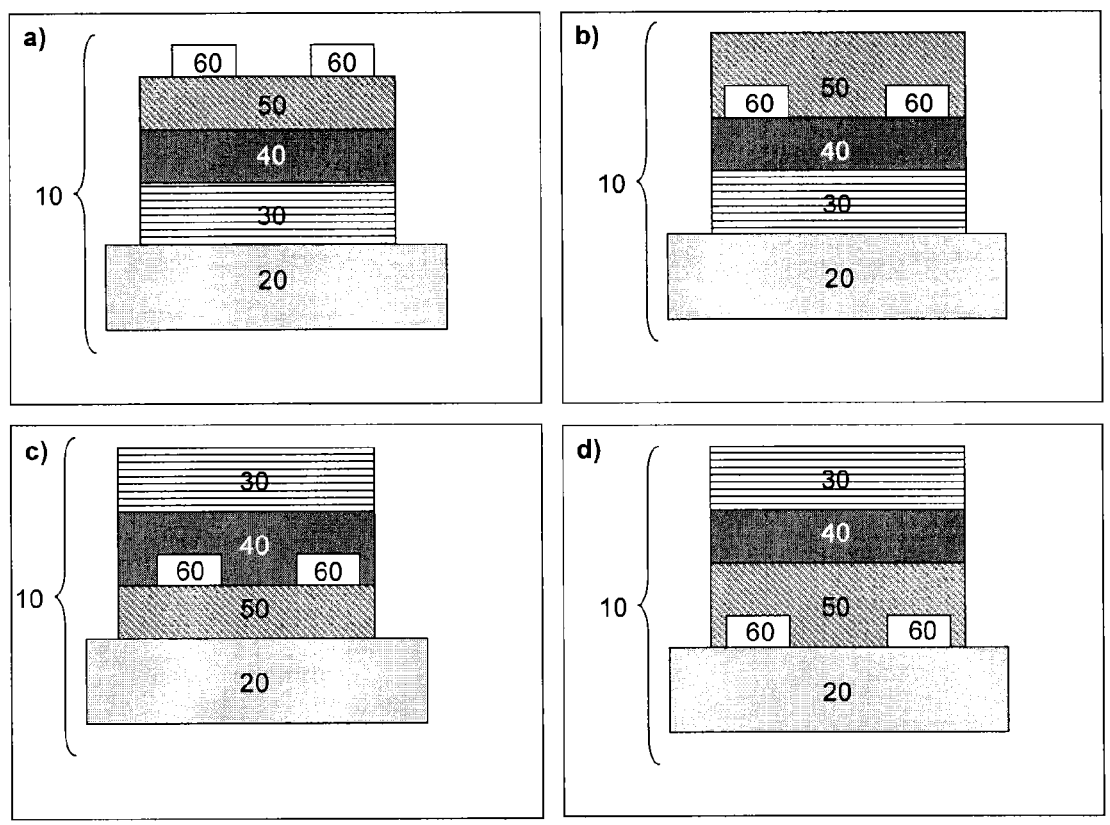
FIG. 1 shows, by way of example, the schematic structure of semiconductor elements (10) known from the prior art. These elements comprise a substrate (20), a gate electrode (30), a dielectric layer (40), an active, semiconductive metal oxide layer (50) and electrode contact sites (60). The respective configurations of the semiconductor components (10) differ in terms of the relative arrangement of the semiconductor layer (50) with respect to the dielectric layer (40) and the substrate (20), and in terms of the position of the electrode contact sites (60). The components, in accordance with their configuration, are referred to as follows a) bottom gate-top contact (BGTC), b) bottom gate-bottom contact (BGBC), c) top gate-top contact (TGTC) and top gate-bottom contact (TGBC).

As described at the outset, processes for semiconductor production by gas deposition are inconvenient and costly. It is therefore an aim in current semiconductor research to develop liquid phase processes for production of suitable semiconductors, since such processes are technically simple to implement and are less expensive. To date, the use of such processes has been limited by the fact that these processes can be used to produce only semiconductors with inadequate electrical stability.

In the prior art, the problem of inadequate electrical stability of semiconductors which have been produced by means of liquid phase processes is solved by the introduction of extraneous metal atoms into the semiconductor layer. For example, this is supposed to prevent oxygen from escaping from the semiconductor.

This solution has the disadvantage that it generally adversely affects the underlying performance of the component. More particularly, the introduction of extraneous atoms into the semiconductor layer reduces charge carrier mobility.

The inventors of the present invention have now found that, surprisingly, particularly thin metal oxide layers with a thickness of ≤20 nm present within a semiconductor laminate between a second metal oxide layer and a dielectric layer have particular advantages with regard to the performance thereof.

Without being bound to a particular theory, it is assumed that the thin metal oxide layer is doped by small amounts of metal atoms from the second metal oxide layer, as a result of which a distinct improvement in stability is achieved for the same charge carrier mobility.

Thus, such a semiconductor laminate has an electrical stability comparable to semiconductor layers which are produced by introducing extraneous atoms in the liquid phase. In contrast to the known processes, the increase in stability in the present process, however, is not at the cost of a loss of charge carrier mobility, and for this reason semiconductor laminates of the present invention have an improvement in charge carrier mobility over the prior art. Therefore, the process claimed generates novel high-performance semiconductor laminates.

In a first aspect, the present invention therefore relates to a liquid phase process for producing a semiconductor laminate, the semiconductor laminate comprising a first metal oxide layer, a second metal oxide layer and a dielectric layer, the first metal oxide layer being arranged between the second metal oxide layer and the dielectric layer, and the process comprising: (i) forming a first metal oxide layer comprising at least one metal oxide selected from the group consisting of indium oxide, gallium oxide, zinc oxide, tin oxide or mixtures thereof from a first liquid phase, the first metal oxide layer having a layer thickness of ≤20 nm and the first liquid phase comprising at least one metal oxide or at least one metal oxide precursor, the metal oxide being selected from the group consisting of indium oxide, gallium oxide, zinc oxide, tin oxide or mixtures thereof; and
(ii) forming a second metal oxide layer comprising at least one metal oxide selected from the group consisting of gallium oxide, zinc oxide, tin oxide, hafnium oxide, silicon oxide, aluminium oxide, titanium oxide, alkali metal oxides, alkaline earth metal oxides or mixtures thereof from a second liquid phase, the second liquid phase comprising at least one metal oxide or at least one metal oxide precursor, the metal oxide being selected from the group consisting of gallium oxide, zinc oxide, tin oxide, hafnium oxide, silicon oxide, aluminium oxide, titanium oxide, alkali metal oxides, alkaline earth metal oxides or mixtures thereof;
the at least one metal oxide of the first layer and the at least one metal oxide of the second layer being different.

This means that the first and second metal oxide layers differ in at least one metal oxide. Further metal oxides that the two layers may contain may be identical and/or different.

In the process according to the invention, the first and second metal oxide layers are formed successively, the specific sequence depending on the desired configuration of the semiconductor element.

In various embodiments, the alkali metal oxides are selected from the group consisting of lithium oxide, sodium oxide, potassium oxide, rubidium oxide and caesium oxide.

The alkaline earth metal oxides are, for example, selected from the group consisting of beryllium oxide, magnesium oxide, calcium oxide, strontium oxide and barium oxide.

In the semiconductor laminate producible in accordance with the invention, the semiconductive first metal oxide layer has a charge carrier mobility between 1 and 100 cm$^2$/Vs (measured at gate-source voltage 50 V, drain-source voltage 50 V, channel width 1 cm and channel length 20 μm), this being determinable via the "gradual channel approximation" model. For this purpose, the formulae known from conventional MOSFETs are used. In the linear range, the following applies:

$$I_D = \frac{W}{L} C_i \mu \left(U_{GS} - U_T - \frac{U_{DS}}{2}\right) U_{DS} \quad (1)$$

where ID is drain current, UDs the drain-source voltage, UGs the gate-source voltage, C/ the area-normalized capacity of the insulator, W the width of the transistor channel, L the channel length of the transistor, μ the charge carrier mobility and UT the threshold voltage.

In the saturation range, there is a quadratic dependence between drain current and gate voltage, which is used in the present case to determine the charge carrier mobility:

$$I_D = \frac{W}{2L} C_i \mu (U_{GS} - U_T)^2 \quad (2)$$

The term "metal oxide precursor" in the context of the present invention is understood to mean a substance or a compound which can be converted to a metal oxide thermally or with electromagnetic radiation, in the presence or absence of oxygen or other oxidizing agents. Examples of metal oxide precursors are elemental metal, metal salts, organometallic compounds, for example metal alkoxides and metal oxo alkoxides, which the person skilled in the art can convert to the corresponding metal oxide.

The term "semiconductor laminate" in the context of the present invention relates to a laminate which consists of at least three layers, a first and a second metal oxide layer and a dielectric layer.

The term "dielectric layer" refers to a layer which consists of dielectric material. Such a layer acts as an insulator at the working temperature of a semiconductor laminate. The dielectric material which is used in the process according to the invention to form the dielectric layer is preferably a material which comprises or consists of a metal or transition metal oxide or nitride, especially silicon oxide or nitride, aluminium oxide, hafnium oxide, titanium oxide, an organic or inorganic polymer. By virtue of the arrangement of the first and second metal oxide layers relative to the dielectric layer, the inventive semiconductor laminate receives an orientation.

Figure 2:
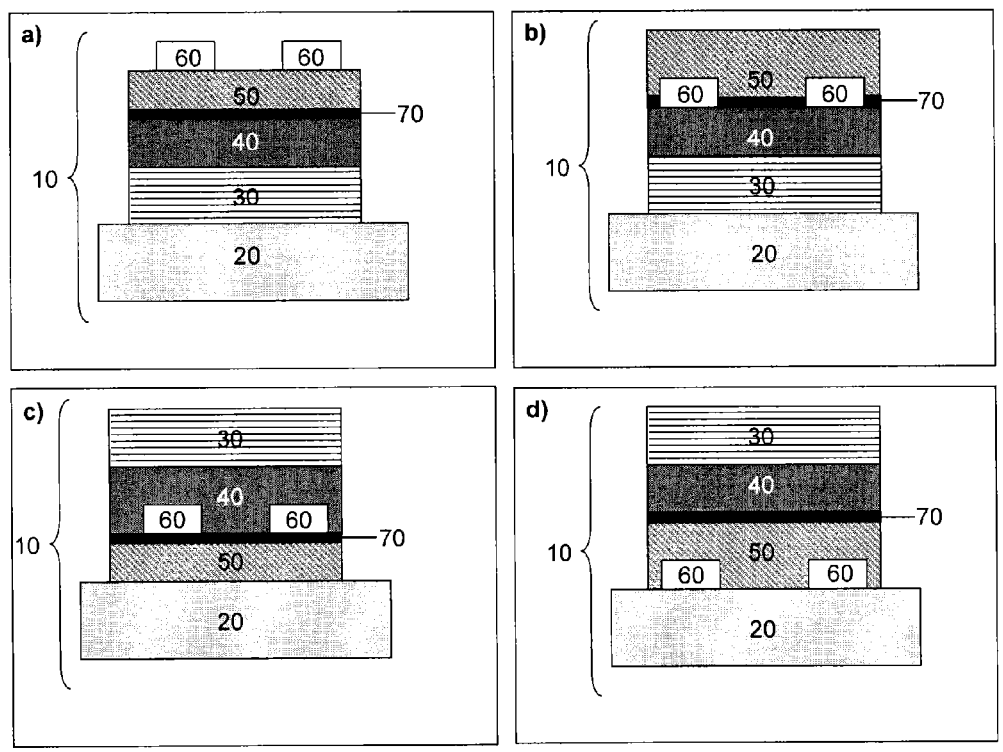
FIG. 2 shows, by way of example, the structure of semiconductor elements (10) which comprise semiconductor laminates according to the present invention. The four variants a)-d) shown by way of example comprise an active, semiconductive first metal oxide layer (70) arranged between a second metal oxide layer (40) and the dielectric layer (40), and differ in terms of the relative arrangement of the first metal oxide layer (70) with respect to the gate electrode (30) and the substrate (20), and in terms of the position of the electrode contact sites (60).

In particular embodiments, a gate electrode adjoins the dielectric layer, and this is thus on the opposite side to the first metal oxide layer. In some embodiments, a substrate adjoins the gate electrode. In some embodiments, a substrate adjoins the second metal oxide layer. The semiconductor laminate may likewise comprise electrode contacts which adjoin the first and/or second metal oxide layer. Source and drain electrodes may be connected to the electrode contacts. Various nonlimiting embodiments of the semiconductor laminate claimed in a semiconductor element are illustrated in FIG. 2.

The term "metal" is understood herein to mean metals, and also semimetals and transition metals. Accordingly, the term "metal oxide" relates to oxides of metals, semimetals and transition metals.

The terms "alkali metal" and/or "alkaline earth metal" as used herein therefore comprise and disclose all metals covered by this group. This means that, if a particular embodiment comprises an alkali metal and/or alkaline earth metal, lithium, sodium, potassium, rubidium and/or caesium are disclosed as the alkali metal, and beryllium, magnesium, calcium, strontium and/or barium as the alkaline earth metal.

The term "metal oxide layer" is understood to mean a metal oxide-, semimetal oxide- and/or transition metal oxide-containing layer. Thus, the first metal oxide layer comprises, for example, indium, gallium, tin and/or zinc atoms or ions, which are present in oxidic or essentially oxidic form. In some cases, the metal oxide layer may also comprise proportions by-products arising from an incomplete conversion or an incomplete removal. For example, the metal oxide layer may also comprise carbene, halogen, alkoxide and/or oxo alkoxide compounds. The first and/or second metal oxide layer may likewise also comprise further metals which may be present in elemental or oxidic form.

The expression "essentially of" in the context of the present invention means that the product or material referred to as such consists to an extent of 60%, 70%, 80%, 90%, 95%, 99%, 99.5% or 99.9% of the substance mentioned or compound mentioned. If the subject is a metal oxide layer being described in detail, the percentage figures should be understood as % by weight. If a liquid phase or atmosphere is being described, the percentage figures should be understood as % by volume.

The term "substrate" relates to a layer which functions as a carrier for the semiconductor laminate. The substrate preferably comprises a material selected from glass, silicon, silicon dioxide, a metal oxide or transition metal oxide, a metal, a polymeric material, especially polyimide (PI), polyethylene terephthalate (PET), polymethyl methacrylate (PMMA) or polycarbonate, and a hybrid substrate formed from inorganic and organic constituents, especially silicon oxide and polyimide.

The term "liquid phase" in the context of the present invention is understood to mean those phases which are in liquid form under SATP conditions ("Standard Ambient Temperature and Pressure"; T=25° C. and p=1013 hPa).

"Anhydrous" compositions in the context of the present invention are those which comprise less than 500 ppm of $H_2O$. Corresponding drying steps which lead to the establishment of correspondingly low water contents of the solvents are known to those skilled in the art.

The expression "forming of a metal oxide layer from the first and/or second liquid phase" can be divided into various stages. In a first step, the first and/or second liquid phase can be used to form a first and/or second solid phase. In the subsequent step, a first and/or second metal oxide layer according to the present invention is formed. In particular embodiments, the two steps proceed simultaneously. If, for example, the first and/or second liquid phase comprises at least one metal oxide, the formation of the solid phase gives rise to a metal oxide layer.

The forming of a first and/or second metal oxide layer from the first and/or second liquid phase may, in some embodiments, comprise a heat treatment step.

A heat treatment of the first and/or second liquid phase may serve to dry the first and/or second liquid phase. Such a heat treatment can be effected at 50-450° C. and may serve to form a first and/or second solid phase from the first and/or second liquid phase.

According to whether the first and/or second liquid phase comprise at least one metal oxide or at least one metal oxide precursor, it is thus possible to directly form a metal oxide layer or first to form a solid phase from metal oxide precursor. Depending on the conditions selected, more particularly the atmosphere, temperature and duration of the heat treatment, a liquid phase comprising at least one metal oxide precursor can likewise be converted directly to a metal oxide layer.

In some embodiments, the heat treatment comprises first a heat treatment at 50 to 350° C., which is followed by a heat treatment at 100-450° C.

In general, the forming of the first and/or second metal oxide layer may proceed over a time interval of seconds to hours. Therefore, the heat treatment for forming the first and/or second metal oxide layer may proceed over a period of seconds to hours. In some embodiments, the heat treatment is one hour.

In particular embodiments, a first and/or second solid phase are formed from a first and/or second liquid phase, a heat treatment of the first and/or second solid phase forming a first and/or second metal oxide layer from the first and/or second solid phase.

Without wishing to be bound to a particular theory, it is assumed that the heat treatment of a metal oxide layer, optionally promoted by electromagnetic radiation, results in reorganization of the atoms in the metal oxide layer, such that the layer has semiconductive properties, or improved semiconductive properties. Accordingly, in various embodiments, the first and/or second liquid phase is subjected to a heat treatment not just until formation of a first and/or second liquid phase, but to further heat treatment until formation of the desired semiconductor properties of the first and/or second metal oxide layer.

The first and/or second metal oxide layer can be formed by heat treatment and/or by electromagnetic radiation. In some embodiments, a heat treatment can be effected with a temperature profile, such that it commences at first with a low temperature, for example 50° C., and this temperature is subsequently increased up to a particular temperature, for example in the range of 150-450° C., and remains there for a defined period. In some embodiments, the temperature is subsequently lowered back to room temperature. The cooling may be slow or rapid. In some embodiments, the forming of the first and/or second metal oxide layer from the first or second liquid phase comprises a heat treatment of the first and/or second liquid phase. This converts the first and/or second liquid phase to a first and/or second solid phase, such that a first and/or second metal oxide layer is formed in the course of further heat treatment.

When the first and/or second liquid phase comprise a metal oxide precursor, the precursors can be converted to the corresponding metal oxide by the heat treatment, such that a first and/or second metal oxide layer is formed. In various embodiments of the process, the first and/or second metal oxide layer are formed by a heat treatment at a temperature of 100-450° C., preferably at 150-360° C. or 150-350° C.

The expression "forming of a metal oxide layer" likewise encompasses embodiments in which the first and/or second liquid phase are irradiated with electromagnetic radiation in order to form the first and/or second metal oxide layer. In various embodiments, the first and/or second liquid phase are irradiated with UV, IR and/or VIS radiation in order to form the first and/or second metal oxide layer. In further embodiments, the first and/or second liquid phase are heat-treated and, before, after and/or during this, irradiated with electromagnetic radiation, especially UV, IR and/or VIS radiation, in order to form the first and/or second metal oxide layer. The combination of a thermal and electromagnetic treatment can improve the formation of the first and/or second metal oxide layer. In particular embodiments, UV radiation crosslinks constituents of the first and/or second liquid phase before or during the heat treatment.

The expression "forming of the first and/or second metal oxide layer" likewise encompasses the treatment of the first and/or second liquid phase with particular atmospheres. In some cases, the first and/or second metal oxide layer is formed under an oxygenous atmosphere, especially air. For formation of the first and/or second metal oxide layer, the first and/or second liquid phase can be treated with heat under an oxygenous atmosphere, especially with air. In further embodiments of the process, the first and/or second liquid phase is used to form a first and/or second solid phase under an oxygenous atmosphere, especially air, and the first and/or second metal oxide layer is formed under an oxygenous atmosphere, especially air, with heat treatment. In various embodiments, a vacuum is first applied in order to form a solid phase from the first and/or second liquid phase, and then the first and/or second metal oxide layer is formed under air, especially by heat treatment under an oxygenous atmosphere, for example air. The forming may likewise comprise process steps which are at first effected with exclusion of air humidity and/or under protective gas and which are followed by steps under an oxygenous atmosphere, especially air. The term "oxygenous atmosphere" in the context of the present invention encompasses a the earth's atmosphere, especially that at sea level ("air"), and a synthetic atmosphere with at least 10% by volume of molecular oxygen. In various embodiments, a synthetic atmosphere comprises at least 20, 30, 40, 50, 60, 70, 80 or 90% by volume of molecular oxygen. In some embodiments, a synthetic atmosphere is an atmosphere which consists essentially or to an extent of 100% by volume of molecular oxygen. In some embodiments, a synthetic atmosphere is an atmosphere enriched with water vapour.

The quality of the first and/or second metal oxide layer obtained by the process according to the invention can also be improved by virtue of the forming of the first and/or second metal oxide layer comprising an upstream, accompanying or subsequent combined thermal and gas treatment (with $H_2O$, $H_2$ or $O_2$), plasma treatment (Ar, $N_2$, $O_2$ or $H_2$ plasma), laser treatment (with wavelengths in the UV, VIS or IR range) or ozone treatment. The first metal oxide layer has a layer thickness of ≤20 nm, preferably of 0.5-20 nm, more preferably of 0.5-10 nm, even more preferably of 2-5 nm. In various embodiments, the first metal oxide layer has a layer thickness which is selected from the group consisting of 0.5-5 nm, 1-5 nm, 2-6 nm, 2-4 nm, 0.5-4 nm, 1-4 nm, 0.5-3 nm, 1-3 nm, 0.5-6 nm and 1-6 nm. In some embodiments, the first metal oxide layer, in various embodiments, has a layer thickness of 1 to 20 nm, 1-15 nm, 1-10 nm, 1-9 nm, 1-8 nm, 1-7 nm, 3-6 nm, 3-5 nm, 2-4 nm, 2-3 nm or 1-2 nm.

The person skilled in the art is aware of prior art processes with which it is possible to form a metal oxide layer having a desired layer thickness from a liquid phase comprising at least one metal oxide or at least one metal oxide precursor. Simple dilution series, for example, are sufficient for this purpose. The resulting layer thicknesses can be determined, for example, by means of ellipsometry (M. Schubert: Infrared Ellipsometry on semiconductor layer structures: Phonons, Plasmons, and Polaritons in: Springer Tracts in Modern Physics 209, Springer-Verlag, Berlin 2004) or atomic force microscopy (AFM; G. Binnig, C. F. Quate, C. Gerber: Atomic force microscope. Physical Review Letters. 56, 1986, p. 930-933). Proceeding from this, the person skilled in the art determines parameters, for example the volume, the metal oxide or metal oxide precursor concentration and, if appropriate, the particle density in the liquid phase that allow him to achieve the desired metal oxide layer thickness in the process according to the invention.

Generally, the first and second metal oxide layers comprise at least one metal oxide, the at least one metal oxide of the first metal oxide layer being different from the at least one metal oxide of the second metal oxide layer. In particular embodiments, the first and/or second metal oxide layer each consist of one metal oxide. In various embodiments, the first and/or second metal oxide layer may consist of two metal oxides in each case. In further embodiments, the first metal oxide layer consists essentially of one metal oxide, and the second metal oxide layer comprises two or more metal oxides. In various embodiments, the first metal oxide layer comprises two or more metal oxides and the second metal oxide layer consists of one metal oxide.

In further embodiments of the process, the second metal oxide layer comprises at least one metal oxide which is not present in the first metal oxide layer. This means that, when each metal oxide layer consists only of one metal oxide, the two metal oxides are different. When the first metal oxide layer consists of two metal oxides and the second metal oxide layer consists of one metal oxide, the metal oxide of the second metal oxide layer is different from the metal oxides of the first metal oxide layer. When both metal oxide layers consist at least of two metal oxides, the second metal oxide layer has at least one metal oxide which is not present in the first metal oxide layer.

In further embodiments of the process, the second metal oxide layer comprises silicon oxide. In some embodiments of the process, the first metal oxide layer consists essentially of indium oxide ($In_2O_3$) or indium gallium oxide. In various embodiments, the first metal oxide layer consists of indium gallium oxide, where the indium:gallium weight ratio is 70:30, 80:20, 90:10, 95:5, 99.0:1.0 to 99.9:0.1. In such a configuration, for example, the second metal oxide layer may consist essentially or exclusively of gallium oxide ($Ga_2O_3$).

In various embodiments, the first metal oxide layer may be a pure indium oxide, gallium oxide, tin oxide and/or zinc oxide layer, i.e., neglecting any carbene, alkoxide, oxo alkoxide or halogen components, consist essentially of indium, gallium, tin and/or zinc atoms or ions present in oxidic form. In some embodiments, the first metal oxide layer may comprise proportions of further metals, which may themselves be in elemental or oxidic form.

In particular embodiments of the process, the second metal oxide layer consists essentially of ZnO, $Ga_2O_3$, $HfO_2$, $SiO_2$, silicon gallium oxide or silicon hafnium oxide.

In further embodiments, the first metal oxide layer consists of indium oxide, gallium oxide, zinc oxide and/or tin oxide. In particular embodiments, the first metal oxide layer consists of pure indium oxide ($In_2O_3$) or indium gallium oxide.

The second layer may, in various embodiments, comprise lithium oxide, sodium oxide, potassium oxide, rubidium oxide, caesium oxide, beryllium oxide, magnesium oxide, calcium oxide, strontium oxide, barium oxide, gallium oxide, zinc oxide, tin oxide, hafnium oxide, silicon oxide, aluminium oxide and/or titanium oxide.

In further embodiments of the process, the second metal oxide layer consists essentially of $Li_2O$, $Na_2O$, $K_2O$, $Ru_2O$, $Cs_2O$, BeO, MgO, CaO, SrO, BaO, $Ga_2O_3$, ZnO, $SnO_2$, $HfO_2$, $SiO_2$, $Al_2O_3$ or $TiO_2$.

In particular embodiments, the first metal oxide layer consists essentially of pure indium oxide ($In_2O_3$) and the second metal oxide layer essentially of $Li_2O$, $Na_2O$, $K_2O$, $Ru_2O$, $Cs_2O$, BeO, MgO, CaO, SrO, BaO, $Ga_2O_3$, ZnO, $SnO_2$, $HfO_2$, $SiO_2$, $Al_2O_3$ or $TiO_2$.

In some embodiments, the first metal oxide layer consists essentially of pure indium gallium oxide and the second metal oxide layer essentially of $Li_2O$, $Na_2O$, $K_2O$, $Ru_2O$, $Cs_2O$, BeO, MgO, CaO, SrO, BaO, $Ga_2O_3$, ZnO, $SnO_2$, $HfO_2$, $SiO_2$, $Al_2O_3$ or $TiO_2$.

The sequence in which the first and second metal oxide layers are formed from the first and second liquid phases can optionally be selected according to what shape is desired for the resulting semiconductor element.

The term "semiconductor element" is understood in the context of the present invention to mean a laminate which comprises the semiconductor laminate of the present invention, and also a substrate and a gate electrode. In this case, the gate electrode adjoins the dielectric layer of the semiconductor laminate of the present invention. The gate electrode is thus on the opposite side of the dielectric layer from the first metal oxide layer. According to whether the gate electrode in the semiconductor element faces toward or away from the substrate in relation to the semiconductor laminate, reference is made to a bottom gate or top gate configuration. The semiconductor element may likewise comprise electrode contacts which adjoin the first and/or second metal oxide layer. Source and drain electrodes may be connected to the electrode contacts. Various nonlimiting embodiments of the semiconductor laminate claimed in such a semiconductor element are shown in FIG. 2.

In several embodiments of the process, the forming of the first metal oxide layer thus comprises the applying of the first liquid phase to the dielectric layer and the depositing of the at least one metal oxide or of the at least one metal oxide precursor of the first liquid phase on the dielectric layer in order to form the first metal oxide layer on the dielectric layer. In these embodiments, the forming of the second metal oxide layer comprises the applying of the second liquid phase to the first metal oxide layer, and the depositing of the at least one metal oxide or of the at least one metal oxide precursor of the second liquid phase on the first metal oxide layer in order to form the second metal oxide layer on the first metal oxide layer. In particular embodiments, the dielectric layer is on a substrate. In that case, the result is a semiconductor element of the bottom gate configuration.

"Depositing" in the context of the present invention is understood to mean that the at least one metal oxide or the at least one metal oxide precursor is deposited on a surface in the form of a solid phase from a first and/or second liquid phase. This includes, for example, adsorption, precipitation, etc. The term "depositing" thus encompasses, for example, the vaporization of the liquid phase and the evaporation of the liquid phase in order thus to form a first and/or second solid phase from a first and/or second liquid phase. The liquid phase can be evaporated, for example, by the heat treatment described herein and/or application of a vacuum or gas stream, more particularly of a stream comprising an oxygenous atmosphere or an air stream. Moreover, the term "depositing" comprises the electrolytic enrichment of the at least one metal oxide or of the at least one metal oxide precursor on a surface. The depositing can likewise be effected by the heat treatment described herein and/or by electromagnetic radiation, especially UV, IR and VIS radiation. In some embodiments, the first and/or second solid phase is a first and/or second metal oxide layer. In other embodiments, the forming of the first and/or second metal oxide layer from the first and/or second liquid phase encompasses the forming of the first and/or second metal oxide layer from the first and/or second solid phase.

In further embodiments of the present process, the forming of the second metal oxide layer encompasses the applying of the second liquid phase on a substrate, and the depositing of the at least one metal oxide or of the at least one metal oxide precursor of the second liquid phase on the substrate in order to form the second metal oxide layer on the substrate. In these embodiments, the forming of the first metal oxide layer encompasses the applying of the first liquid phase to the second metal oxide layer, and the depositing of the at least one metal oxide or of the at least one metal oxide precursor of the first liquid phase on the second metal oxide layer in order to form the first metal oxide layer on the second metal oxide layer, and the applying of the dielectric layer to the first metal oxide layer. In particular embodiments, a gate electrode is subsequently formed on the dielectric layer. The result is then a semiconductor element of the top gate configuration.

The inventors of the present invention have additionally found that, surprisingly, the second metal oxide layer is suitable not just for doping of the first metal oxide layer but also as a passivation layer for a semiconductor element. For example, in the case of a configuration of a semiconductor element in which the dielectric layer, viewed from the first metal oxide layer, faces the substrate, the second metal oxide layer can serve as a passivation layer, such that it concludes the semiconductor element and protects it from atmospheric influences.

For instance, in particular embodiments of the process, the second metal oxide layer may consist essentially of silicon hafnium oxide. Here, for example, the silicon:hafnium weight ratio may be from 70:30 to 99.9:0.1.

In some embodiments of the process, the expression "applying a first and/or second liquid phase" encompasses a process which is selected from the group consisting of printing processes, spraying processes, rotary coating processes, dipping processes and slot-die coating. The term "printing processes" encompasses processes which are selected from the group consisting of, but not limited to, flexographic/gravure printing, inkjet printing, offset printing, digital offset printing and screen printing. Not encompassed by the present invention are processes based on a deposition of the metal oxide layer from the gas phase. In various embodiments, the applying of the first and/or second liquid phase comprises applying with exclusion of an oxygenous atmosphere, air, and/or with reduced air humidity. In further embodiments, the first and/or second liquid phase are applied under protective gas.

In various embodiments of the process, the first and/or second liquid phase comprise at least one organic solvent. In this case, the first and/or second liquid phase may comprise either one solvent or a mixture of various solvents. Suitable solvents are selected from aprotic and weakly protic solvents, especially solvents selected from the group of the aprotic nonpolar solvents. In various embodiments, the organic solvents are essentially anhydrous. The organic solvents are preferably anhydrous. In particular embodiments, for example when metal oxide precursors from the class of organometallic compounds are used, this may facilitate or improve the applying of first and/or second liquid phase and/or the forming of the first and/or second metal oxide layer.

Accordingly, suitable solvents may be selected from the group consisting of substituted and/or nonsubstituted alkanes, substituted and/or nonsubstituted alkenes, substituted and/or nonsubstituted alkynes, substituted and/or nonsubstituted aromatics, aromatics with aliphatic or aromatic substituents, halogenated hydrocarbons, tetramethylsilane, ethers, for example aromatic ethers and substituted ethers, esters or acid anhydrides, ketones, tertiary amines, nitromethane, DMF (dimethylformamide), DMSO (dimethyl sulphoxide), propylene carbonate, alcohols, primary and secondary amines and formamide.

Particularly preferred solvents are alcohols, and also toluene, ethanol, 1-methoxy-2-propanol (PGME), 1-methoxypropan-2-yl acetate (PGMEA), xylene, anisole, mesitylene, n-hexane, n-heptane, tris(3,6-dioxaheptyl)-amine (TDA), 2-aminomethyltetrahydrofuran, phenetole, 4-methylanisole, 3-methylanisole, methyl benzoate, N-methyl-2-pyrrolidone (NMP), tetralin, ethyl benzoate and diethyl ether.

Very particularly preferred solvents are isopropanol, ethanol, PGME, PGMEA, tetrahydrofurfuryl alcohol, tert-butanol and toluene, and mixtures thereof.

In preferred embodiments, the first and/or second liquid phase has/have a viscosity of 1 mPa·s to 10 Pa·s, especially 1 mPa·s to 100 mPa·s, determined to DIN 53019 parts 1 to 2 and measured at room temperature. Such viscosities may be particularly suitable for printing of the corresponding liquid phase.

In some embodiments, the viscosity of the first and/or second liquid phase is determined prior to use. It may therefore be the case that the process claimed further comprises the adjustment of the viscosity of the first and/or second liquid phase to the desired viscosity.

For adjustment of the desired viscosity, thickeners may be added to the first and/or second liquid phase prior to application. Suitable thickeners may be selected from the group consisting of cellulose derivatives, $SiO_2$, which is available under the AEROSIL® trade name, polymethyl methacrylate thickeners, polyvinyl alcohol, urethane thickeners and polyacrylate thickeners.

In various embodiments of the process, the first and/or second liquid phase comprise an aqueous phase. Thus, the first and/or second liquid phase may comprise an aqueous phase or a biphasic or polyphasic system, in which case one phase is an aqueous phase. The at least one further phase may comprise an organic solvent as described herein. In various embodiments, the first and/or second liquid phase are an aqueous solution, dispersion or emulsion.

Suitable possible precursors for the synthesis of metal oxide-containing layers are a multitude of substances and compound classes. As described above, the group of metal oxide precursors comprises elemental metals, metal salts, organometallic compounds, especially metal alkoxides and metal oxo alkoxides.

The term "organometallic compound" in the context of this invention encompasses any compound which comprises at least one metal and at least one organic compound and which can be converted to a metal oxide. Organometallic compounds for the formation of the first metal oxide layer include at least one metal which is selected from the group consisting of indium, gallium, zinc and tin. Organometallic compounds for the formation of the second metal oxide layer comprise at least one metal which is selected from the group consisting of lithium, sodium, potassium, rubidium, caesium, beryllium, magnesium, calcium, strontium, barium, gallium, zinc, tin, hafnium, silicon, aluminium and titanium.

The at least one organic compound of the organometallic compound may, irrespective of whether the precursor serves for the formation of the first and/or second metal oxide layer, comprise at least one radical which from the group consisting of hydrogen, substituted or nonsubstituted $C_{1-50}$ alkyl, substituted or nonsubstituted $C_{2-50}$ alkenyl, substituted or nonsubstituted $C_{2-50}$ alkynyl, substituted or nonsubstituted $C_{1-50}$ alkoxy, substituted or nonsubstituted $C_{5-50}$ aryl, substituted or nonsubstituted $C_{4-50}$ heteroaryl, substituted or nonsubstituted $C_{1-50}$ oxoalkoxy, substituted or nonsubstituted $C_{6-50}$ alkylaryl, substituted or nonsubstituted $C_{6-50}$ aralkyl, substituted or nonsubstituted $C_{5-50}$ alkylheteroaryl, substituted or nonsubstituted $C_{3-50}$ cycloalkyl and substituted or nonsubstituted $C_{2-50}$ heterocycloalkyl. If substituted, the substituents of the organometallic compounds are selected from the group consisting of $C_{1-50}$ alkyl, $C_{2-50}$ alkenyl, $C_{2-50}$ alkynyl, $C_{1-50}$ alkoxy, $C_{5-50}$ aryl, $C_{5-50}$ heteroaryl, $C_{1-50}$ oxoalkoxy, $C_{6-50}$ alkylaryl, $C_{6-50}$ aralkyl, $C_{4-50}$ alkylheteroaryl, $C_{3-50}$ cycloalkyl and $C_{2-50}$ heterocycloalkyl.

In some embodiments, the organometallic compounds comprise at least one halogen which is selected from the group consisting of F, Cl, Br and I.

There are good descriptions of suitable metal oxide precursors in the prior art, and they are thus sufficiently well known to the person skilled in the art. For example, WO2010/094583 A1 and WO2011/020792 A1 disclose suitable metal oxide precursors. The disclosure of these documents is hereby incorporated fully into the disclosure of this patent application. More particularly, the two documents disclose suitable metal alkoxide and metal oxo alkoxide precursors for the production of metal oxide layers and processes for producing such layers.

A metal alkoxide is understood to mean a compound consisting of at least one metal atom, at least one alkoxy radical of the formula —OR(R=organic radical) and optionally one or more organic radicals —R, one or more halogen radicals and/or one or more —OH or —OROH radicals.

Compared to metal alkoxides, metal oxo alkoxides also have at least one further bridging oxygen radical (oxo radical), or one bonded directly to at least one metal atom.

In various embodiments, the metal alkoxide or metal oxo alkoxide is an alkoxide/oxo alkoxide with at least one $C_1$- to $C_{15}$-alkoxy or -oxyalkylalkoxy group, more preferably at least one $C_1$- to $C_{10}$-alkoxy or -oxyalkylalkoxy group. Most preferably, the metal alkoxide and oxo alkoxide is of the generic formula $M(OR)_x$ in which R is a $C_1$- to $C_{15}$-alkyl or -alkyloxyalkyl group, even more preferably a $C_1$- to $C_{10}$-alkyl or -alkyloxyalkyl group. In this formula, x is an integer which corresponds to the oxidation state of the metal (M). In some embodiments, the oxidation state of the metal in the metal precursor corresponds to the oxidation state in which the metal is present later as the metal oxide in the first and/or second metal oxide layer. Particular preference is given to the metal alkoxides $M(OCH_3)_x$, $M(OCH_2CH_3)_x$, $M(OCH_2CH_2OCH_3)_x$, $M(OCH(CH_3)_2)_x$ or $M(O(CH_3)_3)_x$. Even more preferably, $M(OCH(CH_3)_2)_x$ (metal isopropoxide) is used. In the case in which such a metal oxide precursor serves for formation of the first metal oxide layer, M is selected from the group consisting of indium, gallium, zinc and tin. In the case in which such a metal oxide precursor is used for formation of the second metal oxide layer, M is selected from the group consisting of gallium, zinc, tin, hafnium, silicon, aluminium, titanium, alkali metals and alkaline earth metals.

In various embodiments, the first metal oxide layer comprises at least indium oxide and is formed from at least one indium precursor, especially an indium alkoxide precursor or indium oxo alkoxide precursor. The indium alkoxide or indium oxo alkoxide is preferably an indium(III) alkoxide/oxo alkoxide. Further preferably, the indium(III) alkoxide/oxo alkoxide is an alkoxide/oxo alkoxide with at least one $C_1$- to $C_{15}$-alkoxy or -oxyalkylalkoxy group, more preferably at least one $C_1$- to $C_{10}$-alkoxy or -oxyalkylalkoxy group. Most preferably, the indium(III) alkoxide/oxo alkoxide is an alkoxide of the generic formula $In(OR)_3$ in which R is a $C_1$- to $C_{15}$-alkyl or -alkyloxyalkyl group, even more preferably a $C_1$- to $C_{10}$-alkyl or -alkyloxyalkyl group. This is more preferably indium(III) alkoxide or oxo alkoxide $In(OCH_3)_3$, $In(OCH_2CH_3)_3$, $In(OCH_2CH_2OCH_3)_3$, $In(OCH(CH_3)_2)_3$ or $In(O(CH_3)_3)_3$. Even more preferably, $In(OCH(CH_3)_2)_3$ (indium isopropoxide) is used.

The indium alkoxide/oxo alkoxide is present preferably in proportions of 1 to 15% by weight, more preferably 2 to 10% by weight and most preferably 2.5 to 7.5% by weight, based on the total mass of the first liquid phase.

For production of pure indium oxide, gallium oxide, tin oxide and/or zinc oxide layers, in the process according to the invention, only indium, gallium, tin and/or zinc precursors, preferably only oxo alkoxides and alkoxides, are used.

In some embodiments, the first and/or second liquid phase may comprise, as well as metal oxide precursors, also metals in the 0 oxidation state, in order to form metal oxide layers which, as well as the metal oxide, contain further metals in uncharged form.

In some embodiments of the present process, the at least one metal alkoxide precursor of the first and/or second liquid phase originates from the class of the metal alkoxides and/or metal oxo alkoxides.

The present process according to the invention gives particularly good results in the production of the first and/or second metal oxide layer when the sole metal oxide precursor used is the metal alkoxide or metal oxo alkoxide.

In particular embodiments, it is possible to use a metal oxo alkoxide as the metal oxide precursor which has the generic formula $M_xO_y(OR)_z[O(R'O)_cH]_aX_b[R"OH]_d$ where M=In, Ga, Sn and/or Zn for the first metal oxide layer and M=Ga, Sn, Zn, Al, Ti, Li, Na, K, Rb, Cs, Be, Mg, Ca, Sr, Ba, Hf and/or Si for the second metal oxide layer, x=3-25, y=1-10, z=3-50, a=0-25, b=0-20, c=0-1, d=0-25, R, R', R"=organic radical, and X=F, Cl, Br, I. In another embodiment of this kind, the first and/or second liquid phase may comprise an organic solvent, especially an essentially anhydrous, most preferably an anhydrous, organic solvent.

In various embodiments, it is possible to use a metal oxo alkoxide as the metal oxide precursor which has the generic formula $M_xO_y(OR)_z$ where M=In, Ga, Sn and/or Zn for the first metal oxide layer and M=Ga, Sn, Zn, Al, Ti, Li, Na, K, Rb, Cs, Be, Mg, Ca, Sr, Ba, Hf and/or Si for the second metal oxide layer, x=3-20, y=1-8, z=1-25, OR=C1-C15-alkoxy, -oxyalkylalkoxy, -aryloxy or -oxyarylalkoxy group, particular preference being given to using one of the general formula $M_xO_y(OR)$, where M=In, Ga, Sn and/or Zn for the first metal oxide layer and M=Ga, Sn, Zn, Al, Ti, Li, Na, K, Rb, Cs, Be, Mg, Ca, Sr, Ba, Hf and/or Si for the second metal oxide layer, x=3-15, y=1-5, z=10-20, OR=—OCH$_3$, —OCH$_2$CH$_3$, —OCH$_2$CH$_2$OCH$_3$, —OCH(CH$_3$)$_2$ or —O(CH$_3$)$_3$.

In further embodiments, it is possible to use a metal oxo alkoxide as the metal oxide precursor which has the formula $[In_5(\mu_5\text{-}O)(\mu_3\text{-}O^iPr)_4(\mu_2\text{-}O^iPr)_4(O^iPr)_5]$. Such a metal precursor can be used especially for the formation of the first metal oxide layer.

In some embodiments, it is possible to use a metal oxo alkoxide as the metal oxide precursor which has the formula $[Sn_3O(O^iBu)_{10}(^iBuOH)_2]$ and/or $[Sn_6O_4(OR)_4]$. Such metal precursors can be used for the formation of the first and/or second metal oxide layer.

It is likewise possible for metal salts to serve as metal oxide precursors for the production of metal oxide layers. In some embodiments, the first liquid phase comprises at least one metal salt which is selected non-exclusively from the group consisting of halides, nitrates, sulphates, phosphates, carbonates, acetates and oxalates of at least one metal which is selected from the group consisting of indium, gallium, zinc and tin. In further embodiments, the second liquid phase comprises at least one metal salt which is selected nonexclusively from the group consisting of halides, nitrates, sulphates, phosphates, carbonates, acetates and oxalates of at least one metal which is selected from the group consisting of gallium, zinc, tin, hafnium, silicon, aluminium, titanium, alkali metals and alkaline earth metals. Such metal salts can be used, for example, in the aqueous phase. Particular metal salt-containing phases can be used to form metal oxide layers by heat treatment and/or electromagnetic radiation, especially UV radiation.

In some cases, for example for metal halides, the metal salt can be converted to the metal oxide via an intermediate step. For example, a metal halide can first be converted to an organometallic compound, which is then oxidized in order to form the metal oxide layer. In some embodiments, the first and/or second liquid phase for this purpose comprises one or more metal salts, the first and/or second liquid phase comprising an organic solvent. The organometallic compounds thus formed as intermediates comprise the metal alkoxy and metal oxo alkoxy compounds described herein. Such processes are well known in the prior art.

For example, Kim et al. (J. Am. Chem. Soc. (2008) 130: 12580-12581 and supplemental information) disclose the formation of indium oxide proceeding from indium salts. For instance, there are descriptions of components which are produced using a precursor solution composed of $InCl_3$ and the base monoethanolamine (MEA) dissolved in methoxyethanol. After spin-coating of the solution, the corresponding indium oxide layer is formed by a thermal treatment at 400° C.

In some embodiments, the at least one metal oxide precursor of the first and/or second liquid phase is an elemental metal. It is possible here for the elemental metal to be in the form of nanoparticles in the liquid, and to be converted to the metal oxide by means of treatment with an oxygenous atmosphere, for example air, especially with pure oxygen. In some embodiments, the formation of the metal oxide layer is promoted by heat treatment and/or electromagnetic radiation, especially UV, IR and/or VIS radiation. Thus, in some embodiments, the first liquid phase comprises at least one metal oxide precursor from the class of the elemental metals, the metal being selected from the group consisting of indium, gallium, zinc and tin. In some embodiments, the second liquid phase comprises at least one metal oxide precursor from the class of the elemental metals, the metal being selected from the group consisting of gallium, zinc, tin, hafnium, silicon, aluminium, titanium, alkali metals and alkaline earth metals.

In further embodiments, the first and/or second metal oxide layer are formed from a first and/or second liquid phase, in which case the first and/or second liquid comprise at least one metal oxide precursor which is an organometallic compound. For the first liquid phase, the metal of the at least one metal oxide compound is selected from the group consisting of indium, gallium, zinc and/or tin. For the second liquid phase, the metal of the at least one metal oxide compound is selected from the group consisting of gallium, zinc, tin, hafnium, silicon, aluminium, titanium, alkali metals and/or alkaline earth metals. In particular embodiments the first and/or second liquid phases thus obtained are subjected to a heat treatment and/or electromagnetic radiation in order to form the first and/or second liquid phase.

The formation of the first and/or second metal oxide layer can likewise be accomplished by sol-gel processes which are well known in the prior art.

JP 06-136162 A (Fujimori Kogyo K. K.) describes a process for producing a metal oxide film from solution on a substrate, in which a metal alkoxide solution, especially an indium isopropoxide solution, is converted to a metal oxide gel, applied to a substrate, dried and heat-treated, with irradiation of the solution with UV radiation before, during or after the drying and heat treatment step.

JP 09-157855 A (Kansai Shin Gijutsu Kenkyusho K. K.) also describes the production of metal oxide films from metal alkoxide solutions via a metal oxide sol intermediate, which is applied to the substrate and converted to the particular metal oxide by UV radiation. The resulting metal oxide may be indium oxide.

CN 1280960 A describes the production of an indium tin oxide layer from solution via a sol-gel process, in which a mixture of metal alkoxides is dissolved in a solvent, hydrolysed and then used for coating of a substrate with subsequent drying and curing.

Correspondingly, in some embodiments of the present invention, the first and/or second liquid phase may comprise at least one metal alkoxide and water, especially a significant amount of water or a liquid phase composed essentially of water. In sol-gel processes, the first and/or second liquid phase are first converted to gels by hydrolysis and subsequent condensation, and then the first and/or second metal oxide layer are formed by heating and/or electromagnetic radiation.

In some embodiments, the metal oxide precursors and the aqueous phase are only contacted with one another or applied in succession on application. Accordingly, the inventive first and/or second phase can also first be produced on a support and thus applied simultaneously. This may be favourable, especially in the case of sol-gel processes, in order to produce particularly thin and homogeneous layers. This can avoid inhomogeneities in the metal oxide layers and thus prevent the metal oxide layers from having poor layer parameters.

In the present case, inhomogeneity is understood to mean crystal formation in individual domains which leads at the surface to roughnesses of more than Rms=5 nm (rms roughness=root mean square roughness; measured by means of atomic force microscopy). This roughness firstly has an adverse effect on the layer properties of the indium oxide-containing layer (the result is particularly charge carrier mobilities which are too low for semiconductor applications), and secondly has an adverse effect for the application of further layers for production of a component.

In some embodiments of the process, the first and/or second liquid phase comprise at least one metal oxide of the metal oxide particle type. The metal oxide particles are usually nanoparticles.

"Nanoparticles" as used herein refers to particles having a diameter of up to 100 nm, preferably in the range of 1-100 nm. For use in the present process, such metal oxide particles are usually in a printable dispersion. To improve these properties, the liquid phase may further comprise dispersing additives. The liquid phase can be converted to a solid phase by the above-described processes, i.e. by heat treatment and/or electromagnetic radiation, and the metal oxide particles can thus be deposited. In some embodiments, after the printing operation, the metal oxide layer is converted to a semiconductor layer by a sintering operation.

In a further aspect, the present invention relates to a semiconductor laminate which is produced by a process of the present invention.

The present invention further encompasses an electronic component which comprises a semiconductor laminate of the present invention.

Likewise part of the present invention is an electronic component which comprises a semiconductor laminate of the present invention, the electronic component being selected from the group consisting of a transistor, a thin-film transistor, a diode, a solar cell, a sensor, an RFID tag or a TFT back panel for visual display units.

A further aspect of the invention is processes for producing an electronic component, these processes including the processes according to the invention for producing a semiconductor laminate.

Likewise covered by the scope of the present invention is the use of an inventive semiconductor laminate for production of an electronic component.

Such electronic components are selected nonexclusively from the group consisting of a transistor, a thin-film transistor, a diode, a solar cell, a sensor, an RFID tag or a TFT back panel for visual display units.

EMBODIMENTS

Example 1

Production of Semiconductor Laminates

A doped silicon substrate with an edge length of about 15 mm and with a silicon oxide coating of thickness approx. 200 nm and finger structures of ITO/gold was used.

A formulation composed of an indium precursor (5% by weight solution of $[In_5(\mu_5\text{-}O)(\mu_3\text{-}O^iPr)_4(\mu_2\text{-}O^iPr)_4(O^iPr)_5]$ in 1-methoxy-2-propanol) was applied to the silicon oxide by means of spin-coating (2000 rpm; 30 seconds).

The precursor layer was converted to the $In_2O_3$ semiconductor layer (first metal oxide layer) having a layer thickness between 1-20 nm layer thickness by means of a. UV crosslinking (UV treatment for 10 min), followed by b. heat treatment (1 h at 350° C. under air).

Subsequently, a further formulation composed of a metal oxide precursor or precursor mixture in organic solvent was applied to the $In_2O_3$ semiconductor layer by means of spin-coating. The precursor layer was converted to the second metal oxide layer by c. UV crosslinking (UV treatment for 10 min), followed by a d. heat treatment (1 h at 350° C. under air).

The charge carrier mobility and the onset shift were determined for various combinations of a first $In_2O_3$ metal oxide layer with various metal oxides/metal oxide combinations in the second metal oxide layer. A low onset shift indicates a high electrical stability of the semiconductor.

The stress parameters used to determine the onset shift were: $U_{DS}$=10 V and $U_{GS}$=−20 V (negative bias stress test). The stability measurements were conducted under inert conditions ($N_2$) in order to rule out the influence of the atmospheric gases.

Result:

| second layer | Charge carrier mobility | Onset shift after stress for 100 sec. | Onset shift after stress for 200 sec. |
|---|---|---|---|
| none | 12.6 | −2 | −4 |
| Zn oxide | 15.9 | −0.5 | −1.25 |
| Ga oxide | 12 | −0.5 | −0.75 |
| Hafnium oxide | 12 | 0 | 0 |

-continued

| second layer | Charge carrier mobility | Onset shift after stress for 100 sec. | Onset shift after stress for 200 sec. |
|---|---|---|---|
| Silicon oxide | 13 | −0.25 | −0.25 |
| Si + Ga oxide | 12 | 0 | 0.25 |
| Si + Hf oxide | 12 | 0 | 0 |

The results show that the formation of a second metal oxide layer on a thin first semiconductive metal oxide layer achieves stabilization against electrical stress without simultaneously reducing charge carrier mobility.

Example 2

Comparative Example (Incorporation of Metal Atoms)

Figure 3:
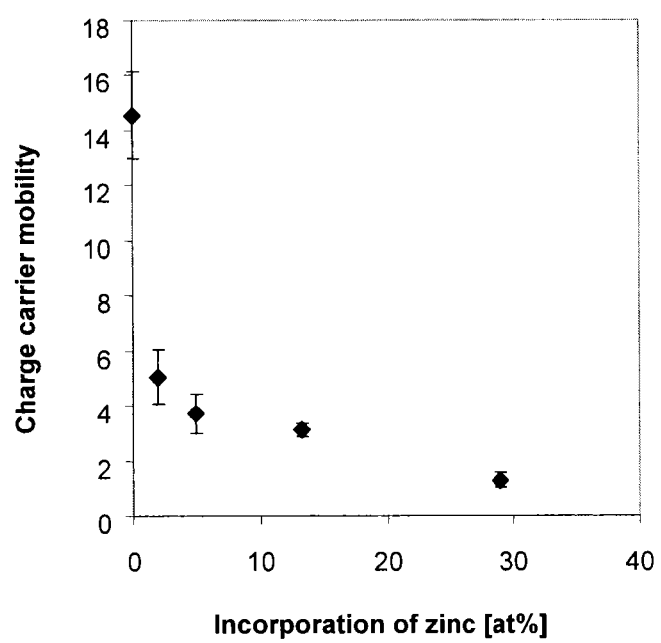
FIG. 3 shows the results of an analysis of a semiconductor layer which was obtained after various amounts of zinc precursor (X axis) had been added to a liquid phase comprising indium precursor, and the liquid phase had been heat-treated. The resulting semiconductor layer was analysed for its charge carrier mobility (Y axis).

The comparative example was conducted as in Example 1, except that no second metal oxide layer has now been formed on the first metal oxide layer. Instead, various amounts of zinc precursor were added to the first liquid phase which contained indium precursor. The charge carrier mobility of the semiconductor with only one metal oxide layer was studied. It was found that a few percent of zinc precursor in the first liquid phase already lead to a severe decline in charge carrier mobility (cf. FIG. 3).

The invention claimed is:

1. A process for producing a semiconductor laminate comprising a first metal oxide layer, a second metal oxide layer and a dielectric layer, wherein the first metal oxide layer is arranged between the second metal oxide layer and the dielectric layer,
the process comprising:
forming a first metal oxide layer comprising at least one metal oxide selected from the group consisting of indium oxide, gallium oxide, zinc oxide, and tin oxide from a first liquid phase, wherein the first metal oxide layer has a layer thickness of ≤20 nm, the first liquid phase comprises a metal oxide or a metal oxide precursor, and the metal oxide is selected from the group consisting of indium oxide, gallium oxide, zinc oxide, and tin oxide; and
forming a second metal oxide layer comprising at least one metal oxide selected from the group consisting of gallium oxide, zinc oxide, tin oxide, hafnium oxide, silicon oxide, aluminium oxide, titanium oxide, alkali metal oxides, and alkaline earth metal oxides from a second liquid phase, wherein the second liquid phase comprises a metal oxide or a metal oxide precursor, and the metal oxide is selected from the group consisting of gallium oxide, zinc oxide, tin oxide, hafnium oxide, silicon oxide, aluminium oxide, titanium oxide, alkali metal oxides, and alkaline earth metal oxides,
wherein the metal oxide of the first layer and the metal oxide of the second layer are different.

2. The process according to claim 1, wherein the first metal oxide layer has a layer thickness of 0.5-20 nm.

3. The process according to claim 1, wherein the second metal oxide layer has at least a layer thickness of the first metal oxide layer.

4. The process according to claim 1, wherein the second metal oxide layer comprises a metal oxide not present in the first metal oxide layer.

5. The process according to claim 1, wherein the second metal oxide layer comprises at least two metal oxides.

6. The process according to claim 1, wherein the first metal oxide layer comprises at least two metal oxides.

7. The process according to claim 1, wherein the second metal oxide layer comprises silicon oxide.

8. The process according to claim 1, wherein the first metal oxide layer consists essentially of indium oxide ($In_2O_3$) or indium gallium oxide.

9. The process according to claim 1, wherein the second metal oxide layer consists essentially of ZnO, $Ga_2O_3$, $HfO_2$, $SiO_2$, silicon gallium oxide or silicon hafnium oxide.

10. The process according to claim 1, wherein the forming of the first metal oxide layer comprises:
applying the first liquid phase to the dielectric layer, and
depositing the metal oxide or the metal oxide precursor of the first liquid phase on the dielectric layer in order to form the first metal oxide layer on the dielectric layer,
and wherein the forming of the second metal oxide layer comprises:
applying the second liquid phase to the first metal oxide layer, and
depositing the metal oxide or the metal oxide precursor of the second liquid phase on the first metal oxide layer in order to form the second metal oxide layer on the first metal oxide layer.

11. The process according to claim 1, wherein the forming of the second metal oxide layer comprises:
applying the second liquid phase on a substrate, and
depositing the metal oxide or the metal oxide precursor of the second liquid phase on the substrate in order to form the second metal oxide layer on the substrate,
and wherein the forming of the first metal oxide layer comprises:
applying the first liquid phase to the second metal oxide layer,
depositing the metal oxide or the metal oxide precursor of the first liquid phase on the second metal oxide layer in order to form the first metal oxide layer on the second metal oxide layer, and
applying the dielectric layer to the first metal oxide layer.

12. The process according to claim 1, wherein the first liquid phase, the second liquid phase, or both, are applied by at least one process selected from the group consisting of a printing process, spraying process, rotary coating process, dipping process and slot-die coating.

13. The process according to claim 1, wherein the metal oxide precursor of the first liquid phase, the second liquid phase, or both, originates from a class of metal alkoxides, metal oxo alkoxides, or both.

14. The process according to claim 13, wherein the first liquid phase, the second liquid phase, or both, comprise an organic solvent.

15. The process according to claim 14, wherein the organic solvent is essentially anhydrous.

16. The process according to claim 1, wherein the first liquid phase, the second liquid phase, or both, comprise a metal oxide of a metal oxide particle type.

17. The process according to claim 1, wherein the first liquid phase, the second liquid phase, or both, comprise an aqueous phase.

18. The process according to claim 1, wherein the forming of the first metal oxide layer, the second metal oxide layer, or both, further comprises a heat treatment of the first liquid phase, the second liquid phase, or both.

19. The process according to claim 1, wherein the forming of the first metal oxide layer, the second metal oxide layer, or both, comprises irradiation of the first liquid phase, the second liquid phase, or both, with electromagnetic radiation.

20. The process according to claim 1, wherein the first metal oxide layer, the second metal oxide layer, or both, are formed under an oxygenous atmosphere.

21. The process according to claim 1, wherein the first metal oxide layer, the second metal oxide layer, or both, are heat-treated at a temperature of 100-450° C.

22. The process according to claim 1, wherein the first metal oxide layer has a layer thickness of 0.5-10 nm.

23. A semiconductor laminate, produced by the process of claim 1.

24. An electronic component, comprising a semiconductor laminate according to claim 23.

25. The electronic component according to claim 24, wherein the electronic component is a transistor, a thin-film transistor, a diode, a solar cell, a sensor, an RFID tag or a TFT back panel suitable for visual display units.

* * * * *